(12) United States Patent
Treiber et al.

(10) Patent No.: US 6,664,463 B1
(45) Date of Patent: Dec. 16, 2003

(54) APPARATUS AND METHOD FOR SHIELDING ELECTROMAGNETIC RADIATION

(75) Inventors: Mark R. Treiber, Philadelphia, PA (US); Peter Klein, Phoenixville, PA (US); Grant M. Smith, Bryn Athyn, PA (US)

(73) Assignee: Unisys Corporation, Blue Bell, PA (US)

( * ) Notice: Subject to any disclaimer, the term of this patent is extended or adjusted under 35 U.S.C. 154(b) by 0 days.

(21) Appl. No.: 09/525,411

(22) Filed: Mar. 15, 2000

(51) Int. Cl.[7] ................................................. H05K 9/00
(52) U.S. Cl. ........................ 174/35 GC; 174/35 R; 361/704; 361/712; 361/816
(58) Field of Search .................... 174/35 R, 16.3; 361/816, 818, 704, 714, 715, 718, 719, 712; 257/712, 713

(56) References Cited

U.S. PATENT DOCUMENTS 5,966,289 A * 10/1999 Hastings et al. ............ 361/704
6,055,159 A *  4/2000 Sun ............................ 361/704

* cited by examiner

*Primary Examiner*—Hung V. Ngo
(74) *Attorney, Agent, or Firm*—Lise A. Rode; Mark T. Starr; Ratner & Prestia

(57) ABSTRACT

An apparatus is provided for dissipating heat from an electronic component, such as a processor, that is mounted in a conductive enclosure and for shielding electromagnetic radiation generated by the electronic component. The apparatus includes a heat sink that is configured to be mounted to a surface of the electronic component. The apparatus also includes a conductor connected to the heat sink. The conductor is configured to provide electrical contact between the heat sink and a surface of the conductive enclosure. Accordingly, the apparatus at least partially shields the electromagnetic radiation generated by the electronic component. A corresponding method is also provided.

2 Claims, 7 Drawing Sheets

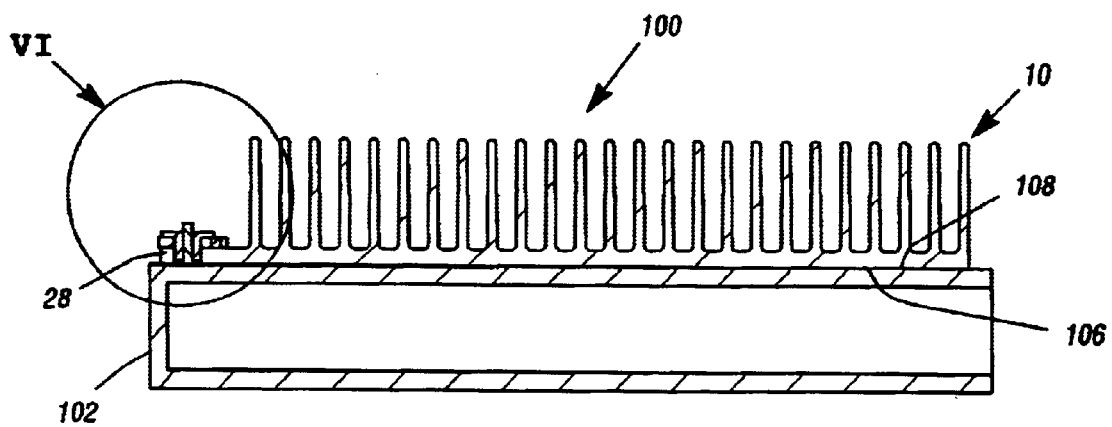
Figure 5
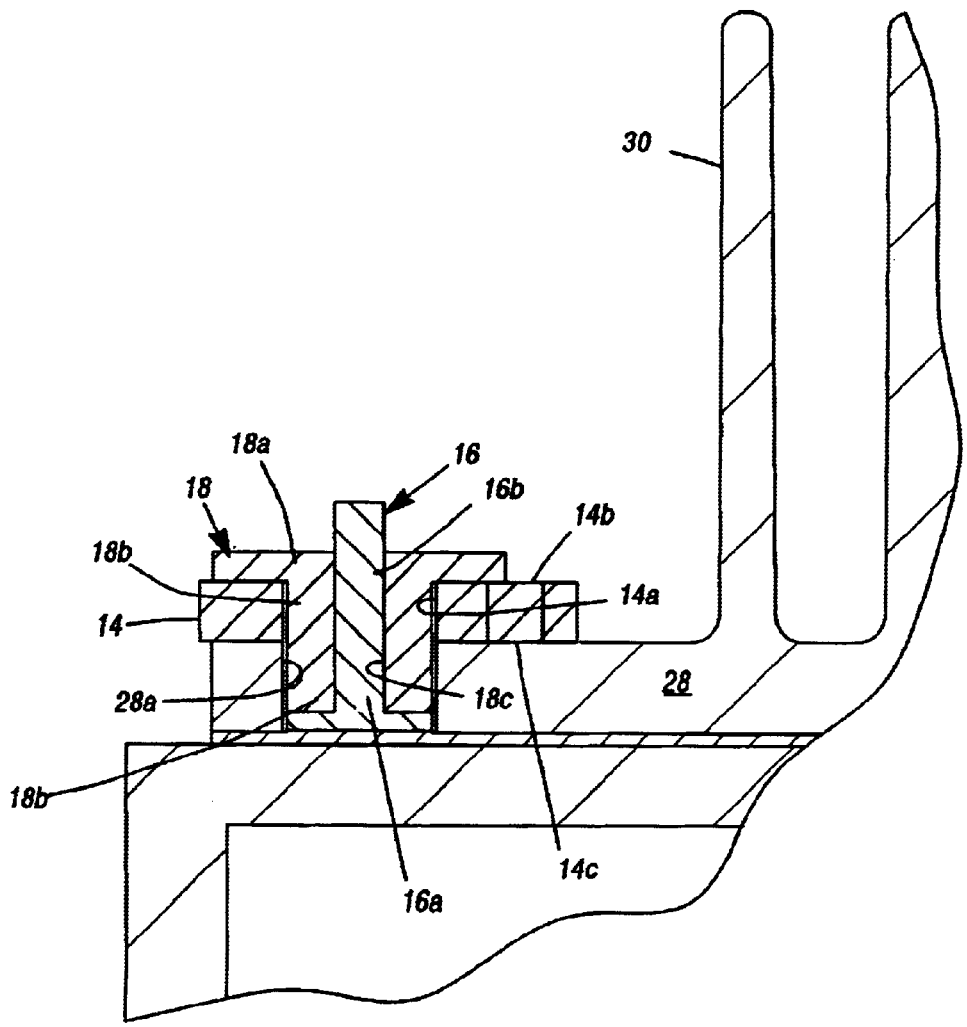
Figur 6

APPARATUS AND METHOD FOR SHIELDING ELECTROMAGNETIC RADIATION

FIELD OF THE INVENTION

This invention relates to an apparatus and method for shielding electromagnetic radiation. More specifically, this invention relates to an apparatus for dissipating heat from an electronic component, such as a processor for example, mounted in a conductive enclosure and for shielding electromagnetic radiation generated by the electronic component.

BACKGROUND OF THE INVENTION

The frequencies at which electronic components operate have been increasing as computer systems function at higher speeds. As electronic components (such as processors) used in computer systems increase in speed, the amount of electromagnetic radiation or electromagnetic interference (EMI) produced by the electronic components increases. Such electromagnetic radiation can adversely affect circuit performance, and electromagnetic emissions radiating from sources inside electronic equipment can threaten circuits in nearby equipment. Accordingly, electromagnetic radiation from commercial equipment should be controlled and limited.

Furthermore, it has been recognized that some packaging components can exacerbate the radiation of electromagnetic energy. For example, when frequencies are high, a heat sink used to dissipate heat from an electronic component can actually act as an antenna for the propagation of electromagnetic energy. This phenomenon depends on the frequency and length of the fins of the heat sink, among other factors.

Attempts have been made to "shield" electromagnetic radiation in order to limit electromagnetic emissions and protect nearby equipment. For example, one form of shielding uses conductive enclosures in order to reduce radiated electromagnetic energy by reflection and/or absorption of that energy. The performance of such shielding depends upon the properties and configurations of the shielding material, including the material's conductivity, permeability, and thickness. Shielding performance also can depend upon the frequency of the electromagnetic radiation as well as the distance from the source of the radiation to the shield.

In view of the recent increases in the speed of computer processors, it has become increasingly difficult to reduce electromagnetic emissions through shielding by means of equipment enclosures. Shielding at the cabinet level (i.e., by means of the use of gasketing materials, perforated metal, etc.) is increasingly difficult to achieve because, as the frequency of the electromagnetic radiation increases, the wavelengths of the electromagnetic radiation are reduced, thereby allowing the electromagnetic radiation to escape through smaller apertures in the equipment enclosure.

Accordingly, there remains a need for an apparatus and method for shielding electromagnetic radiation generated by electronic components such as processors.

SUMMARY OF THE INVENTION

This invention provides an apparatus for dissipating heat from an electronic component that is mounted in a conductive enclosure and for shielding electromagnetic radiation generated by the electronic component. The apparatus includes a heat sink that is configured to be mounted to a surface of the electronic component. The apparatus also includes a conductor connected to the heat sink. The conductor is configured to provide electrical contact between the heat sink and a surface of the conductive enclosure. Accordingly, the apparatus at least partially shields the electromagnetic radiation generated by the electronic component.

This invention also provides an assembly for shielding electromagnetic radiation generated by an electronic component such as a processor. The assembly includes a processor configured to be mounted within a conductive enclosure, a heat sink mounted to the processor for dissipating heat from the processor, and a conductor pivotally mounted to the heat sink, wherein the conductor is configured to provide electrical contact between the heat sink and a surface of the conductive enclosure.

This invention also provides a method for dissipating heat from an electronic component such as a processor and for shielding electromagnetic radiation generated by the electronic component. The method includes the step of providing an assembly including an electronic component and a heat sink mounted to the electronic component for dissipating heat from the electronic component. The method also includes the step of mounting the assembly within a conductive enclosure. The heat sink of the assembly is electrically connected to a surface of the conductive enclosure, thereby at least partially shielding the electromagnetic radiation generated by the electronic component.

BRIEF DESCRIPTION OF THE DRAWINGS

The invention will be described with reference to the exemplary embodiment illustrated in the figures of which:

FIG. 5 is a cross-sectional side view of the assembly illustrated in FIG. 4.

FIG. 6 is a detail of the assembly illustrated in FIG. 5.

DETAILED DESCRIPTION OF THE INVENTION

Preferred features of embodiments of this invention will now be described with reference to the figures. It will be appreciated that the spirit and scope of the invention is not limited to the embodiments selected for illustration. Also, it should be noted that the drawings are not rendered to any particular scale or proportion. It is contemplated that any of the configurations and materials described hereafter can be modified within the scope of this invention.

It has been discovered that significant advantages can be enjoyed when electromagnetic radiation is shielded at its source. This is especially true as processor speeds increase and smaller electromagnetic signal wavelengths make it possible for electromagnetic emissions to escape through smaller apertures of the equipment enclosures in which the sources of the electromagnetic radiation are mounted. Accordingly, the apparatus and method of to this invention makes it possible to at least partially shield the electromagnetic radiation generated by a component such as a processor.

Figure 1:
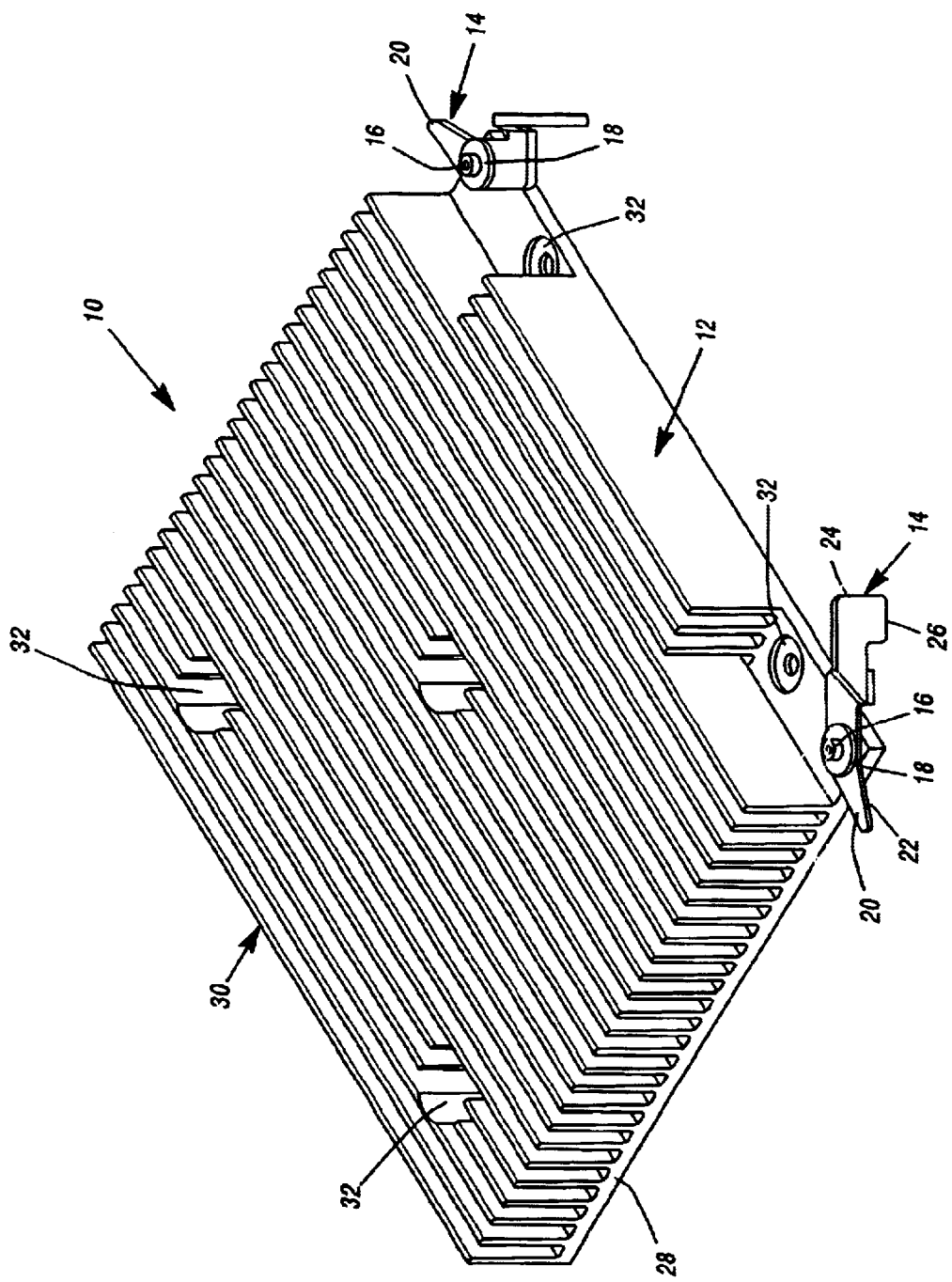
FIG. 1 is a top perspective view of an embodiment of an apparatus according to this invention.

One embodiment of an apparatus according to this invention is illustrated in FIG. 1. Referring to FIG. 1, an apparatus 10 is provided for dissipation of heat from a processor (not shown in FIG. 1) mounted in a conductive enclosure (not shown in FIG. 1) and for shielding electromagnetic radiation generated by the processor. The apparatus 10 includes a heat sink 12 configured to be mounted to a processor's surface. The apparatus 10 also includes a conductor, such as lever 14, connected to the heat sink 12. The conductor 14 is configured to provide electrical contact between the heat sink 12 and a surface of the conductive enclosure. Accordingly, the electromagnetic radiation generated by the processor is at least partially shielded.

The conductor 14 can be pivotally mounted to the heat sink 12. More specifically, the apparatus 10 can be provided with a fastener such as rivet 16 pivotally mounting the conductor 14 to the heat sink 12. When the fastener 16 is provided in the form of a rivet as shown in FIG. 1, the rivet defines an axis about which the conductor 14 pivots.

The conductor 14, when provided in the form of a lever, preferably has an end portion 20 positioned to engage a surface of the conductive enclosure (not shown in FIG. 1). Accordingly, electrical contact is provided between the heat sink 12 and the conductive enclosure. Preferably, a surface such as lower surface 22 of lever 14 contacts a surface of the heat sink 12 to provide electrical contact between the lever 14 and the heat sink 12. Also, the lever 14 is preferably provided with an opposite end portion 24 positioned for manipulation of the lever 14 to engage the end portion 20 of the lever 14 with the surface of the conductive enclosure. Additionally, the opposite end portion 24 of the lever 14 can be configured to contact the heat sink 12, thereby providing electrical contact between the heat sink 12 and the lever 14. More specifically, the opposite end portion 24 of lever 14 can be provided with an extension 26 that contacts an edge portion of heat sink 12 when the lever 14 is engaged.

As is illustrated in FIG. 1, the heat sink 14 is preferably provided with a base portion 28 configured for contact with a processor's surface. Heat sink 12 is also preferably provided with heat transfer fins 30 extending from the base portion 28. As is illustrated in FIG. 1, the conductor or lever 14 is connected to the base portion 28 of the heat sink 12.

The fastener used to pivotally mount lever 14 to heat sink 12 can include a rivet 16 as well as a washer 18. Also, five (5) mounting holes 32 are provided in heat sink 12, extending through base portion 28, to facilitate mounting of apparatus 10 to a processor.

Although various embodiments of conductor 14 can be utilized to practice this invention, the embodiment of the conductor selected for illustration in the figures is in the form of a lever. The position of lever 14 illustrated in FIG. 1 is a "disengaged position" in that end portion 20 of lever 14 is in a position to release apparatus 10 (and an accompanying processor) from a conductive enclosure. Also, opposite end portion 24 of lever 14 is pivoted away from the edge of the base portion 28 of the heat sink 12.

As will be described subsequently with reference to FIG. 8, when lever 14 is in an "engaged position," end portion 20 of lever 14 will be in a position to engage a surface of the conductive enclosure. Also, extension 26 of opposite end portion 24 of lever 14 will contact an edge of base portion 28 of heat sink 12. In the engaged position, lever 14 can as a conductor providing electrical contact between the heat sink 12 and the conductive enclosure. More specifically, conductive lever 14 in the engaged position will make electrical contact with a surface of the conductive enclosure by means of end portion 20. Also, lever 14 in the engaged position will be in electrical contact with heat sink 12 by means of contact between surface 22 of lever 14 and the top surface of base portion 28 of heat sink 12. Also, when in the engaged position, extension 26 of lever 14 preferably contacts an edge of base portion 28 of heat sink 12 to provide electrical contact.

Although the materials selected for use in forming apparatus 10 may vary within the scope of this invention, heat sink 12 is preferably formed from a conductive metal such as aluminum. Also, the washer 18 used in conjunction with rivet 16 is preferably formed from a polymeric material such as nylon. Lever 14, which provides a conductive path between heat sink 12 and the conductive enclosure, can be formed from a metallic material such as carbon steel. Rivet 16 can be in the form of a standard pop rivet, which can be formed from aluminum, steel, or other suitable materials.

Figure 2:
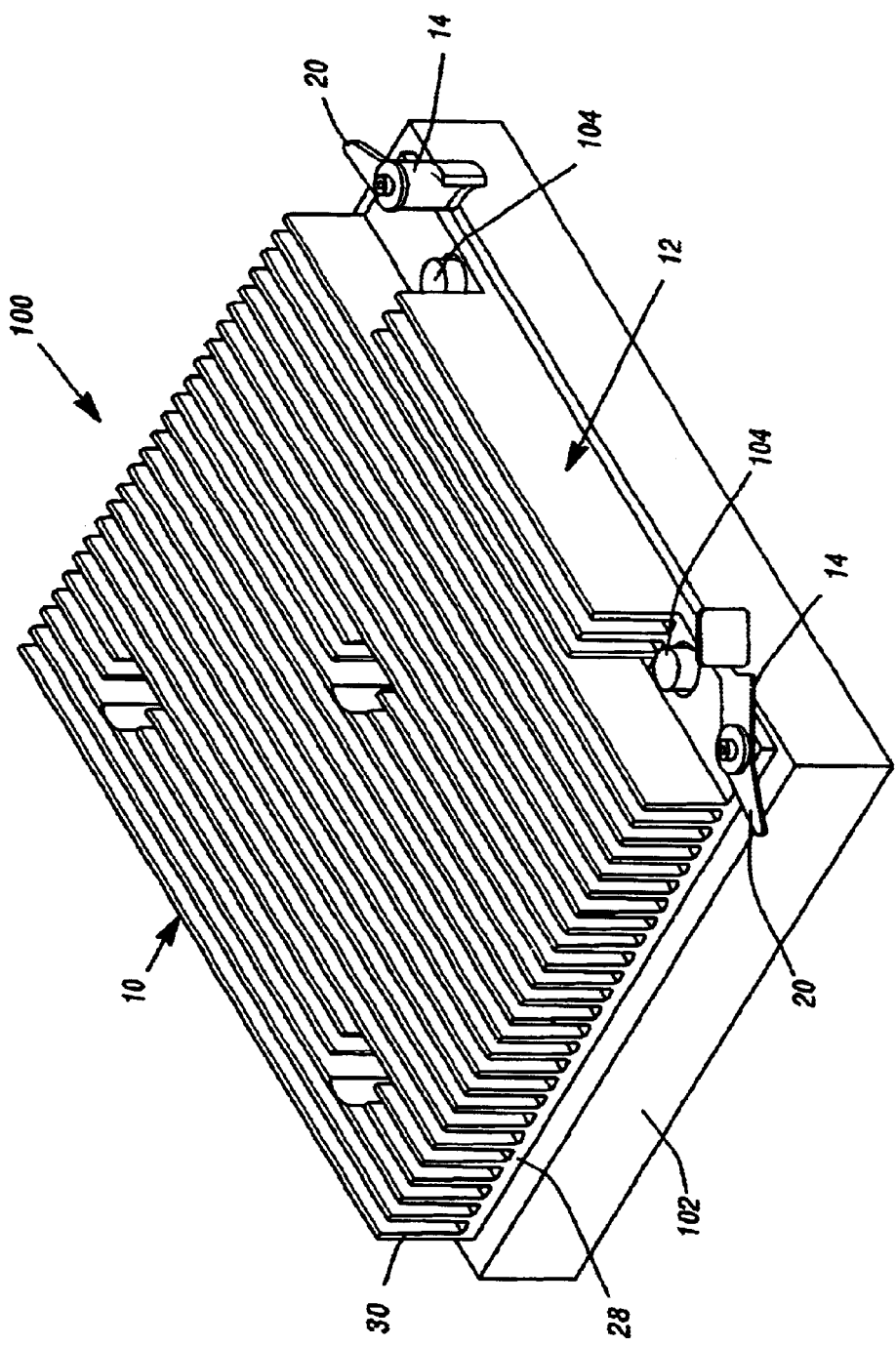
FIG. 2 is a top perspective view of an embodiment of an assembly according to this invention.

An embodiment of an assembly for shielding electromagnetic radiation generated by a processor is illustrated in FIG. 2. The assembly 100 generally includes the apparatus 10 (illustrated in FIG. 1) connected to a processor 102. More specifically, the assembly 100 includes a processor 102 configured to be mounted within a conductive enclosure (not shown in FIG. 2). The assembly also includes a heat sink 12 mounted to the processor 102 for dissipating heat from the processor 102. The heat sink 12 includes a base portion 28 configured for contact with the processor 102 and heat transfer fins 30 extending from the base portion 28. A conductor such as lever 14 is pivotally mounted to the base portion 28 of the heat sink 12. The conductor 14 is configured to provide electrical contact between the heat sink 12 and a surface of the conductive enclosure. Accordingly, the electromagnetic radiation generated by the processor 102 is at least partially shielded by the heat sink.

As is illustrated in FIG. 2, mounting hardware 104 is provided to mount heat sink 12 to the processor 102. Mounting hardware 104 preferably includes threaded fasteners such as screws that extend through the mounting holes 32 provided in heat sink 12. It will be noted with reference to FIG. 2 that the levers 14, which are illustrated in the disengaged position, extend slightly beyond the side edges of processor 102. In other words, although end portions 20 of levers 14 extend outwardly well beyond the side edges of the heat sink 12 as is illustrated in FIG. 1, the width of the processor 102 is larger than that of the heat sink 12; therefore, the degree to which end portions 20 of the levers 14 extend beyond the side edges of processor 102 is less than the degree to which end portions 20 extend beyond the side edges of heat sink 12. This aspect of assembly 100 is also illustrated in FIG. 3.

Figure 3:
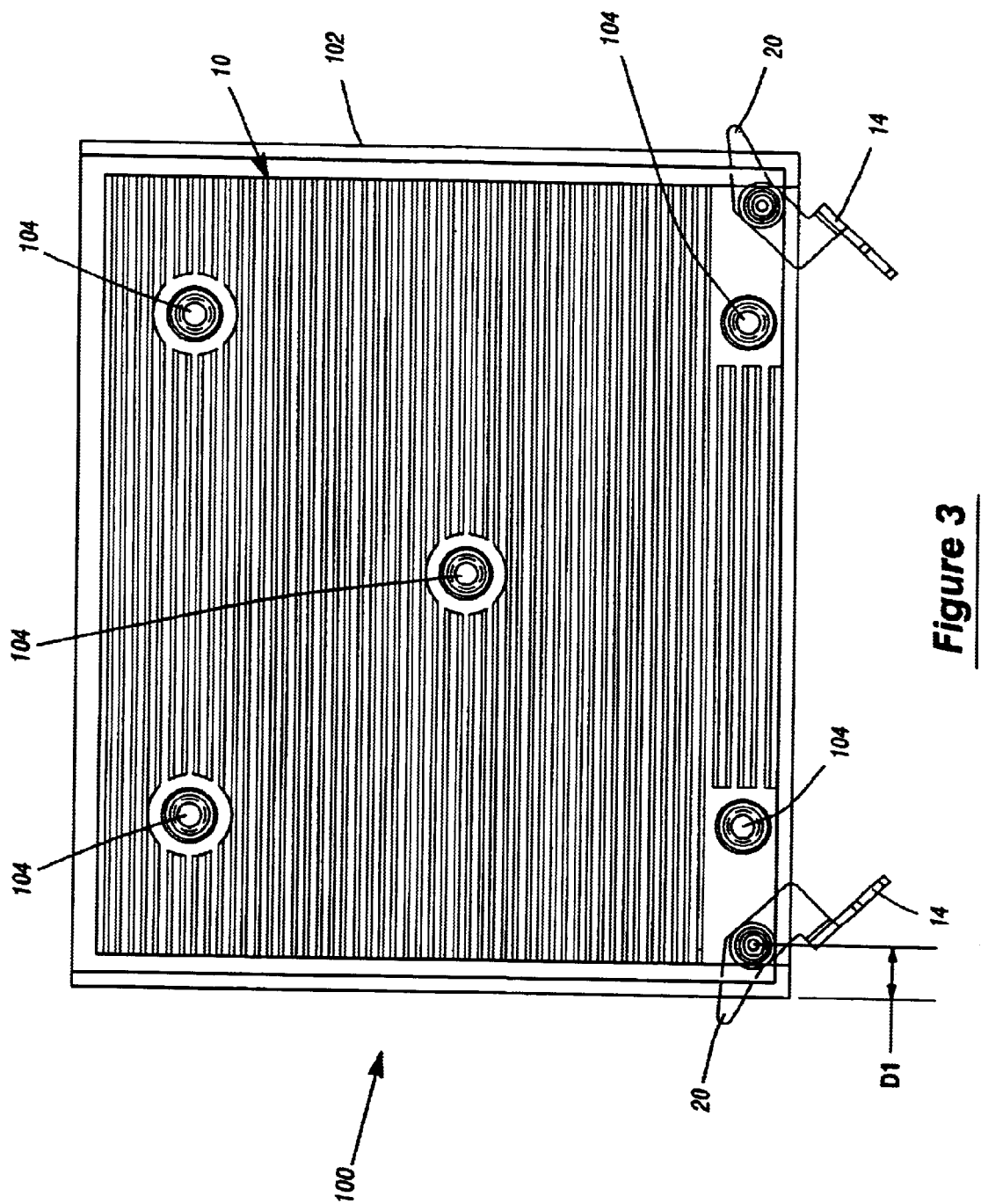
FIG. 3 is a top view of the assembly illustrated in FIG. 2.

Referring now to FIG. 3 which shows a top view of assembly 100, the levers 14 of apparatus 10 are again illustrated in the disengaged position. The distance D1 between the axis about which the conductors pivot and the side edges of processor 102 is selected such that assembly 100 can be installed into and removed from a conductive enclosure when the levers 14 are in the disengaged position, as shown. As will be described later with reference to FIGS. 7 and 8, when opposite end portions 24 of levers 14 are advanced to a position adjacent the front edge of heat sink 12 (placing levers 14 in the engaged position), end portions 20 of levers 14 will engage surfaces of the conductive enclosure.

Figure 4:
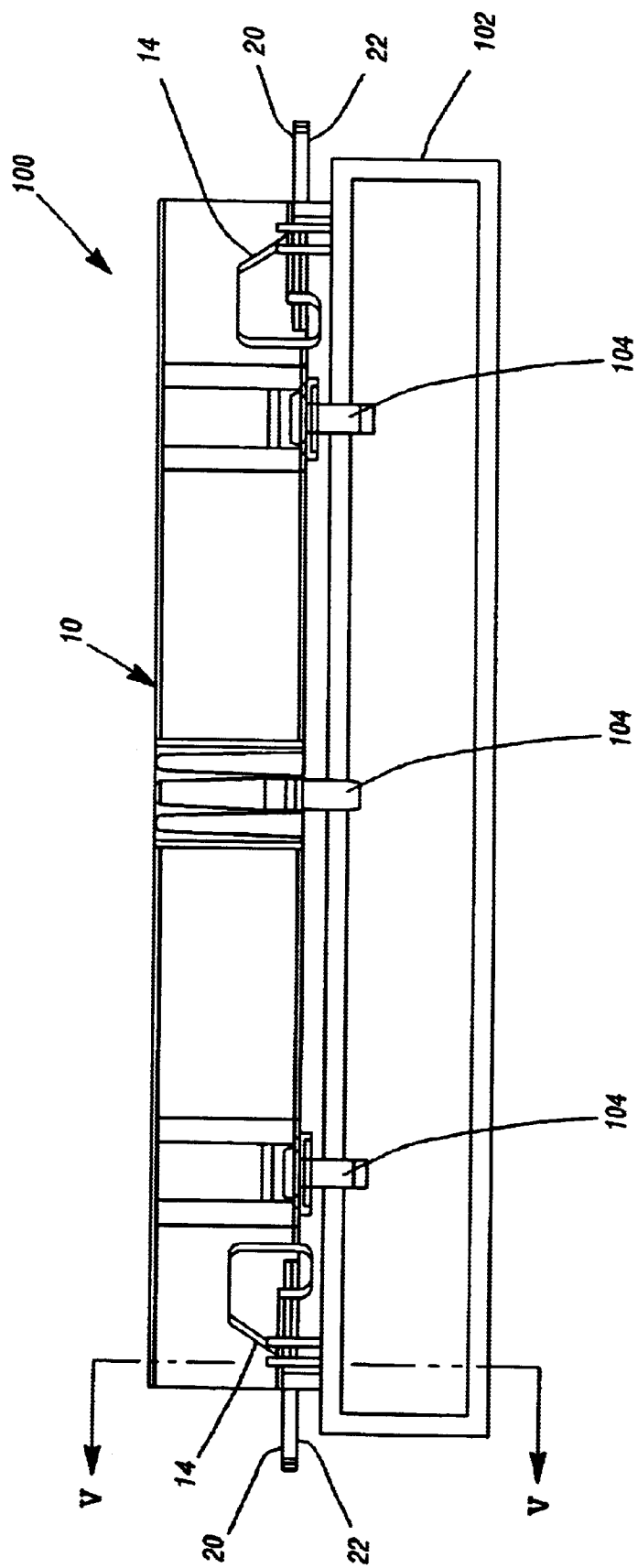
FIG. 4 is a front view of the assembly illustrated in FIG. 2.

Referring now to FIG. 4, a view from the front of assembly 100 is provided. FIG. 4 reveals further details of the mounting hardware 104 used to mount heat sink 12 of apparatus 10 to the processor 102. FIG. 4 also illustrates the extent to which end portions 20 of levers 14 extend beyond the edge surfaces of processor 102.

FIG. 5 provides a cross-sectional side view of assembly 100 based on the cross-section indicated in FIG. 4. As is illustrated in FIG. 5, it can be seen that a bottom surface 106 of the base portion 28 of heat sink 12 contacts an upper surface 108 of the processor 102. Accordingly, heat sink 12 provides for conductive heat transfer from the processor 102. A conductor such as conductive tape can be provided between the heat sink and the processor to facilitate improved conductive heat transfer therebetween. Conductive heat sink 12 conducts heat generated by processor 102 to heat transfer fins 30. By means of heat transfer fins 30, convective heat transfer is brought about as air flows past the processor assembly 100.

Referring now to the detail illustrated in FIG. 6, which reveals details of the cross-sectional side view illustrated in FIG. 5, the rivet 16 includes a head 16a and a body 16b that extends upwardly from the head 16a. Washer 18 is a shoulder washer having a flange 18a and a body 18b, which flange 18a and body 18b together define an opening 18c extending therethrough. Lever 14 is provided with an opening 14a extending between the top and bottom surfaces 14b and 14c of lever 14. Finally, an opening 28a is provided in base portion 28 of heat sink 12 at a location that is spaced from heat transfer fins 30.

As assembled, lever 14 is positioned adjacent and in contact with base portion 28 of heat sink 12. More specifically, a bottom surface 14c of lever 14 (illustrated as surface 22 in FIG. 1) contacts a top surface of base portion 28, thereby providing electrical contact between the lever 14 and heat sink 12.

The openings 14a and 28a in the lever 14 and base portion 28, respectively, are aligned to accommodate washer 18. More specifically, the body 18b of washer 18 extends downwardly into openings 14a and 28a. A bottom surface of flange 18a of washer 18 rests upon the top surface 14b of lever 14. Body 16b of rivet 16 extends upwardly through the opening 18c defined in the washer 18. The rivet 16 is "popped" in order to engage the heat sink 12, washer 18, and lever 14 into an assembly. Lever 14 is pivotally mounted so that it can rotate about the axis of the body 16b of rivet 16.

Figure 7:
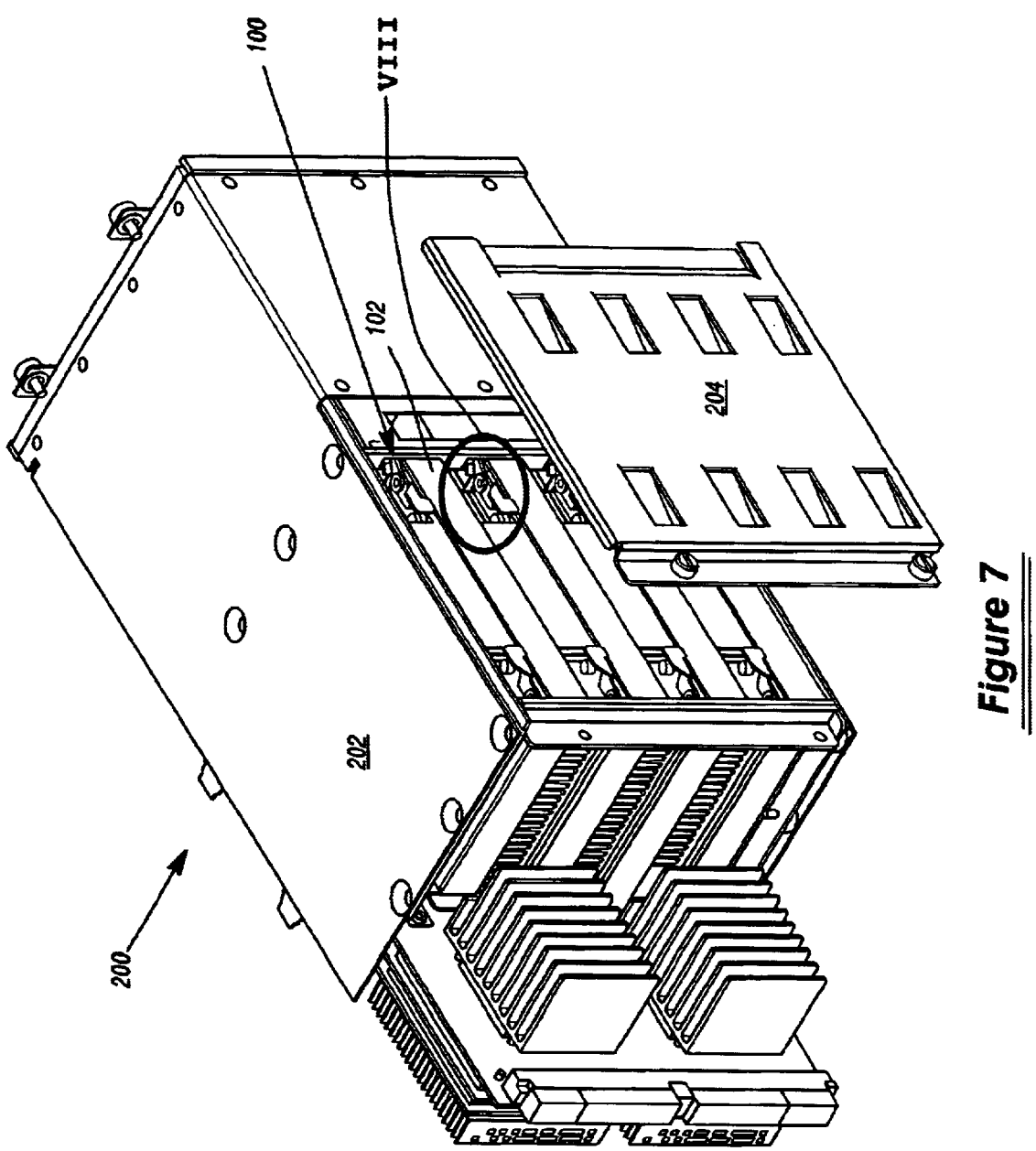
FIG. 7 is a top perspective view of another embodiment of an assembly according to this invention.

Another embodiment of an assembly accordingly to this invention is illustrated in FIG. 7. Generally speaking, the assembly illustrated in FIG. 7 includes a metallic chassis that provides a conductive enclosure for multiple processor assemblies as well as electronic assemblies. More specifically, assembly 200 is an assembly of assembly 100, apparatus 10, and a conductive enclosure.

Referring specifically to the embodiment of assembly 200 illustrated in FIG. 7, assembly 200 is adapted for shielding electromagnetic radiation generated by the processors 102. The assembly 200 includes a conductive enclosure 202. A processor 102 (as a component of assembly 100) is mounted within the conductive enclosure 202. Referring to FIGS. 1–7, a heat sink 12 (a component of apparatus 10) is mounted to the processor 102 for dissipating heat from the processor 102. The heat sink 12 includes a base portion 28 that is configured for contact with the processor's surface. The heat sink 12 also includes heat transfer fins 30 extending from the base portion 28. A conductor such as lever 14 is pivotally mounted to the base portion 28 of the heat sink 12. The conductor 14 contacts a surface of the conductive enclosure 202 to provide electrical contact between the heat sink 12 and the conductive enclosure 202. Accordingly, the electromagnetic radiation generated by the processor 102 is at least partially shielded.

The conductor 14 can be provided in the form of a lever having an end portion 20 positioned to engage a surface of the conductive enclosure 202. Accordingly, electrical contact is provided between the heat sink 12 and the conductive enclosure 202. A surface of the lever 14 (such as surface 22) contacts a surface of the heat sink 12 (such as surface 28a) to provide electrical contact between the lever 14 and the heat sink 12. The lever 14 also has an opposite end portion 24 positioned for manipulation of the lever 14 to engage the end portion 20 of the lever 14 with the surface of the conductive enclosure 202.

Assembly 200 can also include additional structural features such as a door 204 to further enclose the processor assemblies. Although the electromagnetic radiation generated by the processors is at least partially shielded by the use of apparatus 10, the conductive enclosure 202, together with the door portion 204, provides additional shielding as a barrier to electromagnetic emissions generated from within the conductive enclosure 202. The conductive enclosure 202 also provides a barrier against the invasion of electromagnetic radiation generated outside of conductive enclosure 202 in order to prevent such radiation from entering the enclosure.

Figure 8:
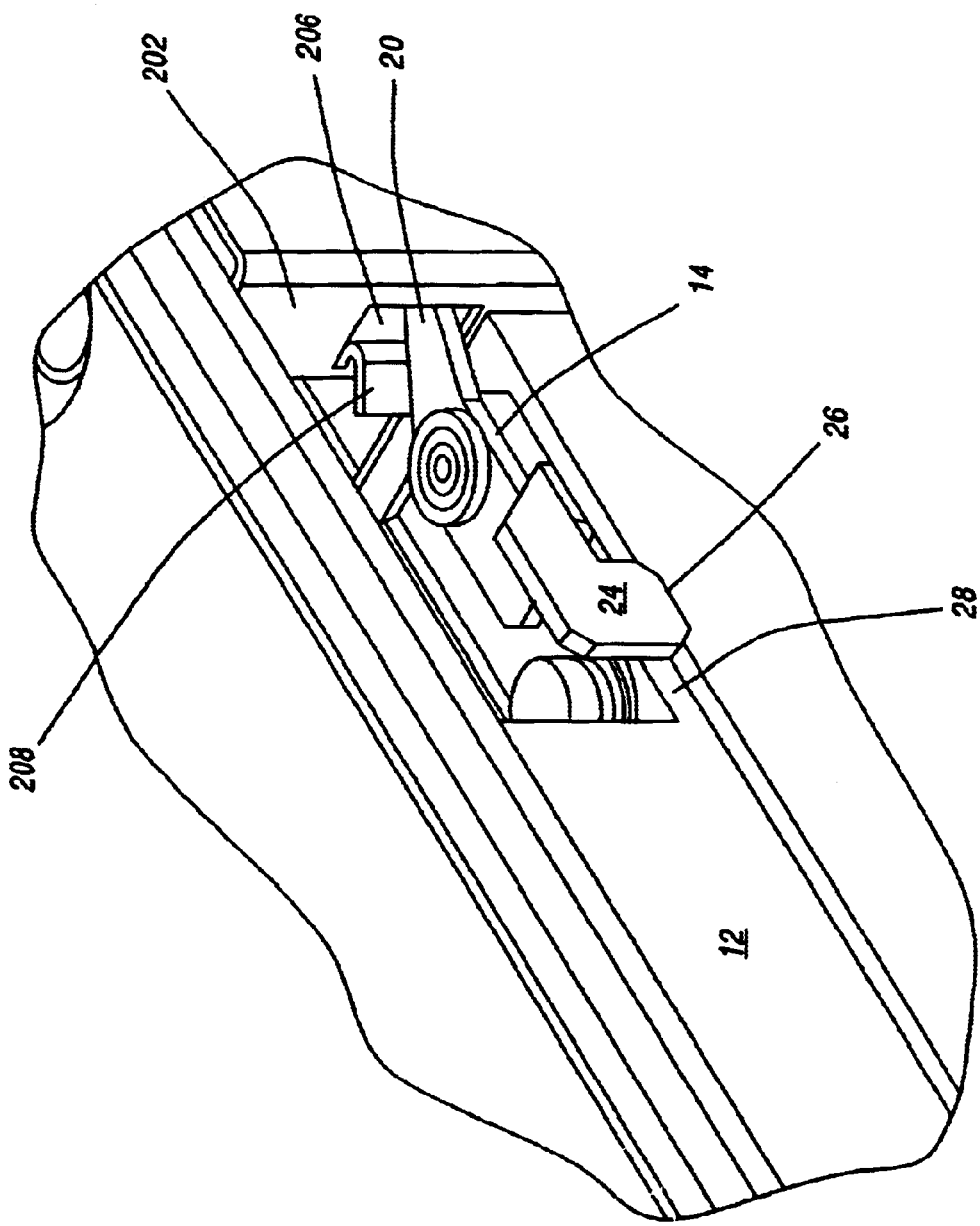
FIG. 8 is a top perspective view of a detail of the assembly illustrated in FIG. 7.

Referring now to the detail from FIG. 7 provided in FIG. 8, the engagement provided between assembly 100 and the conductive enclosure is illustrated. As was discussed previously, the lever 14 is illustrated in FIG. 8 in the engaged position. Specifically, extension 26 of opposite end portion 24 of the lever 14 is in contact with the edge of the base portion 28 of heat sink 12. The end portion 20 of lever 14 is also shown to be positioned to engage the surface of the conductive enclosure 202. More specifically, conductive enclosure 202 is provided with an aperture 206, which is defined on three sides by an edge and on a fourth side by a flange 208 which extends inwardly toward apparatus 10 of assembly 100.

When in the engaged position illustrated in FIG. 8, end portion 20 of lever 14 extends into aperture 206 and into engagement with the flange 208 of conductive enclosure 202. Accordingly, in the engaged position illustrated in FIG. 8, the lever 14 serves two (2) distinct functions. Lever 14 provides a conductive path for electrical connection between conductive enclosure 202 and heat sink 12 thereby "grounding" the heat sink to the enclosure to provide an EMI shield. Also, lever 14 provides for mechanical engagement of the processor assembly 100 within conductive enclosure 202.

As is illustrated in the perspective view of FIG. 7, the door portion 204 of the conductive enclosure 202 is provided with a series of eight (8) flanges that are configured to extend inwardly of conductive enclosure 202 for contact with the facing edges of the processors 102. These flanges, which have a spring-like configuration, also help to maintain the assemblies 100 in place within the conductive enclosure 202 on discrete mounting tracks (not shown). Further details of an embodiment of conductive enclosure 202 are described in pending application Ser. No. 09/285,814 (MODULAR PACKAGING CONFIGURATION AND SYSTEM AND METHOD OF USE FOR A COMPUTER SYSTEM ADAPTED FOR OPERATING MULTIPLE OPERATING SYSTEMS IN DIFFERENT PARTITIONS), filed Apr. 2, 1999, which is incorporated herein by reference in its entirety.

The method according to this invention will now be described with general reference to the figures. This invention provides a method for dissipating heat from a component such as processor 102 and for shielding electromagnetic radiation generated by the component. The method includes the step of providing a processor assembly 100 including a processor 102 and a heat sink 12 mounted to the processor 102 for dissipating heat from the processor 102. The method also includes the step of mounting the processor assembly 100 within a conductive enclosure 202. Electrical contact is provided between the heat sink 12 of the processor assembly 100 and a surface such as flange 208 of the conductive enclosure 202. Accordingly, the electromagnetic radiation generated by the processor 102 is at least partially shielded by means of the heat sink and the "grounding" connection between the conductive heat sink and the conductive enclosure.

In an embodiment wherein the processor assembly 100 further includes a conductor 14 pivotally mounted to the heat sink 12, the method also includes the step of engaging an end portion 20 of the conductor 14 to the surface 208 of the conductive enclosure 202. Accordingly, electrical contact is provided between the heat sink 12 and the conductive enclosure 202.

A heat sink can be grounded to the motherboard of a computer system in order to provide a current path for heat sink "noise" to ground as an alternative to grounding the heat sink directly to the enclosure or chassis of the computer system. For example, a conductor can be used to provide contact between a heat sink and a motherboard ground plane.

Although a heat sink can be grounded to the motherboard on which the corresponding electronic component is mounted, it has been discovered that a direct electrical connection (by means of a conductor) between the heat sink and the enclosure is preferred. For example, such a direct connection between the heat sink and the enclosure avoids the transmission of electromagnetic radiation to a ground plane in the motherboard, which can adversely impact the performance of the motherboard circuitry. Also, grounding the heat sink to the motherboard requires additional space on the motherboard for grounding pads. According to preferred features of this invention, a direct connection between the heat sink and the enclosure (as opposed to grounding the heat sink to the motherboard) makes it possible to use a single, conductive component that provides engagement between the heat sink and the enclosure in addition to providing the electrical connection. In other words, no additional hardware or conductor need be added to the assembly, and the conductor can be configured to perform dual functions.

Although this invention has been described reference to various preferred features of the invention, it should be appreciated that variations and modifications of the preferred features can be made without departing from the spirit or scope of the invention. The preferred embodiment includes two conductors, such as levers for example, at side edge portions of the heat sink and on the top surface of the base of the heat sink. It is of course contemplated that a single conductor can be utilized or that multiple conductors (three or more) can be utilized on various surfaces of the heat sink or processor. Also, although the invention has been described with respect to certain preferred materials of construction, it is contemplated that the various components can be formed from other suitable materials as well. Additionally, although the invention has been described with respect to the shielding of the electromagnetic radiation generated by processors, this invention applies to the shielding of electromagnetic radiation generated by various electronic components, and this invention is not limited to processors.

According to preferred embodiments of this invention illustrated in the figures, a lever can be used as the conductor to bring about electrical contact between the heat sink and the enclosure. The use of a lever as the conductor facilitates the dual functions of (1) providing electrical contact between a heat sink and an enclosure and (2) engaging an electronic component within the enclosure. The conductor can also take other forms. For example, the conductor can include a rod or other form of plunger that is spring-biased into contact with the enclosure. The plunger can retract against the bias of the spring as the electronic component is installed into the enclosure. To bring about engagement, the plunger can be positioned to engage a surface of the enclosure upon installation of the electronic component in the enclosure due to the bias of the spring. Other forms of conductors and latching mechanisms are contemplated as well.

It will be appreciated that other modifications can be made to the illustrated embodiments without departing from the scope of the invention. The scope of the invention is separately defined in the appended claims.

What is claimed is:

1. An apparatus for dissipating heat from an electronic component mounted in a conductive enclosure and for shielding electromagnetic radiation generated by the electronic component, said apparatus comprising:
    a heat sink configured to be positioned adjacent a surface of the electronic component; and
    a conductor connected to said heat sink;
    said conductor forming an electrical contact extending from said heat sink and configured to provide electrical contact between said heat sink and a surface of the conductive enclosure, said heat sink being a shield for at least a portion of the electromagnetic radiation generated by the electronic component,
    said conductor being pivotally coupled to said heat sink; and
    a fastener pivotally coupling said conductor to said heat sink,
    said fastener comprising a rivet defining an axis about which said conductor pivots.

2. An assembly for shielding electromagnetic radiation generated by a processor, said assembly comprising:
    a processor configured to be mounted within a conductive enclosure;
    a heat sink mounted to said processor for dissipating heat from said processor, said heat sink comprising a base portion configured for contact with said processor and heat transfer fins extending from said base portion; and
    a conductor pivotally coupled to said base portion of said heat sink;
    said conductor forming an electrical contact extending from said base portion of said heat sink and configured to provide electrical contact between said heat sink and a surface of the conductive enclosure, said heat sink being a shield for at least a portion of the electromagnetic radiation generated by said processor; and
    a fastener pivotally coupling said conductor to said heat sink,
    said fastener comprising a rivet defining an axis about which said conductor pivots.

* * * * *